(12) United States Patent
Yu et al.

(10) Patent No.: US 7,141,857 B2
(45) Date of Patent: Nov. 28, 2006

(54) SEMICONDUCTOR STRUCTURES AND METHODS OF FABRICATING SEMICONDUCTOR STRUCTURES COMPRISING HAFNIUM OXIDE MODIFIED WITH LANTHANUM, A LANTHANIDE-SERIES METAL, OR A COMBINATION THEREOF

(75) Inventors: Zhiyi Yu, Gilbert, AZ (US); Jay A. Curless, Phoenix, AZ (US); Yong Liang, Gilbert, AZ (US); Alexandra Navrotsky, Davis, CA (US); Sergey Ushakov, Davis, CA (US); Bich-Yen Nguyen, Austin, TX (US); Alexander Demkov, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/883,180

(22) Filed: Jun. 30, 2004

(65) Prior Publication Data

US 2006/0003602 A1   Jan. 5, 2006

(51) Int. Cl.
  *H01L 29/94* (2006.01)
  *H01L 21/469* (2006.01)
(52) U.S. Cl. ...................... 257/405; 438/785
(58) Field of Classification Search ................ 438/517, 438/766, 778, 785; 257/405, 411, 610, 642, 257/646, 650
See application file for complete search history.

(56) References Cited

U.S. PATENT DOCUMENTS 5,766,973 A * 6/1998 Goebel et al. .............. 438/460
6,060,755 A * 5/2000 Ma et al. .................... 257/410
6,835,662 B1 * 12/2004 Erhardt et al. .............. 438/689
2004/0092073 A1 * 5/2004 Cabral et al. ............... 438/287
2004/0153426 A1 * 8/2004 Nugent ........................ 706/25
2005/0020444 A1 * 1/2005 Hiraoka et al. ............. 502/350
2005/0151210 A1 * 7/2005 Li et al. ...................... 257/410

OTHER PUBLICATIONS

Ushakov et al.; "Effect of La and Y on Crystallization Temperatures of Hafnia and Zirconia"; *J. Mater. Res.*, 2004, vol. 19, No. 3, pp. 693-696.
Lettieri et al.; Critical Issues in the Heteroepitaxial Growth of Alkaline-Earth Oxides on Silicon; *J. Vac. Sci. Technol.* A20(4), pp. 1332-1340, (Jul./Aug. 2002).
Edge, Lisa F.; "Development of LaAlO$_3$ by MBE for High-K Gate Applications Task ID-606.024"; *Materials Science amd Engineering Department and Materials Research Institute*, Pennsylvania State University.

* cited by examiner

*Primary Examiner*—Calvin Lee
(74) *Attorney, Agent, or Firm*—Ingrassia, Fisher & Lorenz

(57) ABSTRACT

Semiconductor structures and processes for fabricating semiconductor structures comprising hafnium oxide layers modified with lanthanum oxide or a lanthanide-series metal oxide are provided. A semiconductor structure in accordance with an embodiment of the invention comprises an amorphous layer of hafnium oxide overlying a substrate. A lanthanum-containing dopant or a lanthanide-series metal-containing dopant is comprised within the amorphous layer of hafnium oxide. The process comprises growing an amorphous layer of hafnium oxide overlying a substrate. The amorphous layer of hafnium oxide is doped with a dopant having the chemical formulation LnO$_x$, where Ln is lanthanum, a lanthanide-series metal, or a combination thereof, and X is any number greater than zero. The doping step may be performed during or after growth of the amorphous layer of hafnium oxide.

11 Claims, 2 Drawing Sheets

SEMICONDUCTOR STRUCTURES AND METHODS OF FABRICATING SEMICONDUCTOR STRUCTURES COMPRISING HAFNIUM OXIDE MODIFIED WITH LANTHANUM, A LANTHANIDE-SERIES METAL, OR A COMBINATION THEREOF

FIELD OF THE INVENTION

The present invention generally relates to semiconductor structures and to methods for their fabrication, and more particularly relates to semiconductor structures and methods for forming semiconductor structures utilizing hafnium oxide layers doped with lanthanum oxide, a lanthanide-series metal oxide, or a combination thereof.

BACKGROUND OF THE INVENTION

As future generations of electronic devices advance in complexity and decrease in size, a growing need exists for a dielectric material more effective than $SiO_2$. Increased demands on ultra-large scale integrated (ULSI) circuits have required that the $SiO_2$ that forms the gate oxide of field-effect transistors be made thinner and thinner. Eventually, however, the $SiO_2$ layers will be required to be so thin that electron tunneling will make current leakage unacceptably high for low-power devices.

Amorphous hafnium oxide ($HfO_2$), also known as hafnia, has been identified as a promising candidate to replace $SiO_2$ as a gate dielectric. Hafnium oxide, having a relatively high bulk dielectric constant (k=25), would allow gate oxides to be physically thicker (for a given capacitance), which could significantly reduce tunneling. Hafnium oxide also exhibits a large band gap (approximately 5.7 eV) and a band offset (greater than 1 eV) with substrates such as silicon. Further, the diffusion of hafnium atoms into substrates such as silicon, particularly during or after post-deposition anneals, has proven to be negligible.

However, amorphous hafnium oxide tends to crystallize at relatively low temperatures (approximately 400° C.) to form monoclinic and/or tetragonal crystallites. Polycrystalline hafnium oxide facilitates unwanted metal or impurity diffusion through grain boundaries and degrades gate stack performance. Further, the surface of polycrystalline hafnium oxide is rough, with varied crystal orientation, making it difficult to control the workfunction of the overlying gate metal that is dependent on the surface crystal orientation of the polycrystalline hafnium oxide layer.

Accordingly, it is desirable to provide a semiconductor structure that comprises a modified hafnium oxide layer that exhibits relatively lower leakage current density, higher crystallization onset temperatures and stability in the amorphous phase. In addition, it is desirable to provide a method for fabricating a semiconductor structure that comprises a modified hafnium oxide layer that exhibits relatively higher crystallization onset temperatures and stability in the amorphous phase. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
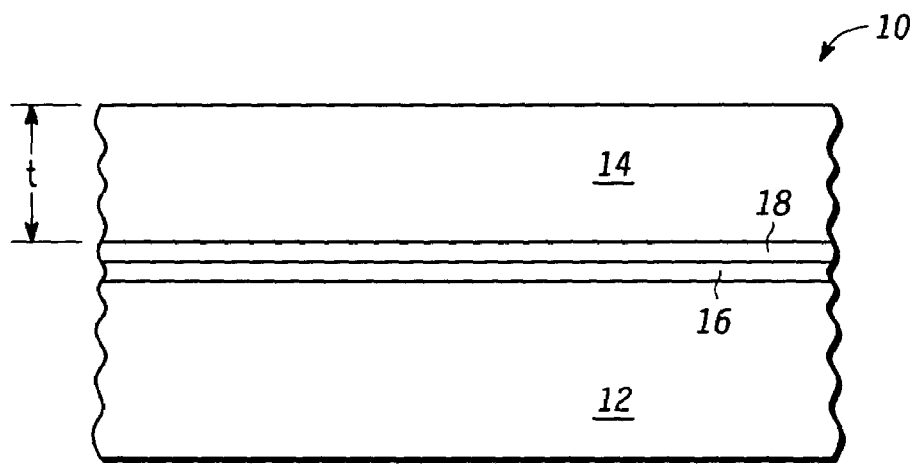
FIG. 1 is a cross-sectional view of a semiconductor structure in accordance with an exemplary embodiment of the present invention.

FIG. 1 illustrates schematically, in cross section, a portion of a semiconductor structure 10 in accordance with an exemplary embodiment of the present invention. Semiconductor structure 10 comprises a substrate 12, which may comprise any suitable semiconductor, compound semiconductor, or metal. The wafer can be of, for example, a material from Group IV. of the Periodic Table. Examples of Group IV semiconductor materials include silicon, germanium, mixed silicon and germanium, mixed silicon and carbon, and the like. Substrate 12 also may comprise other substrates commonly used in the semiconductor industry, such as, for example, gallium arsenide. Substrate 12 also may comprise a metal, such as platinum, molybdenum, copper or aluminum, as required for a particular device application, such as a metal-insulator-metal application. In a preferred embodiment of the invention, substrate 12 comprises silicon.

Semiconductor structure 10 further comprises an amorphous layer 14 of hafnium oxide ($HfO_2$) overlying substrate 12. In one embodiment of the invention, the hafnium oxide layer 14 has a thickness "t," measured from proximate to the surface of substrate 12, in the range of about 25 to about 50 angstroms. In a more preferred embodiment of the invention, the hafnium oxide layer 14 has a thickness "t" in the range of about 25 to about 35 angstroms. However, it will be appreciated that the hafnium oxide layer 14 may be more than 50 angstroms in thickness or less than 25 angstroms in thickness depending on a desired device application.

The amorphous layer 14 of hafnium oxide comprises a lanthanum oxide ($LaO_x$) dopant, a lanthanide-series metal oxide dopant, or a dopant comprising a combination of lanthanum oxide and a lanthanide-series metal oxide. The lanthanide series of the Periodic Chart includes the following metals: cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm ), ytterbium (Yb), and lutetium (Lu). It will be appreciated that any metal in the lanthanide series of the Periodic Chart may be utilized to form the lanthanide-series metal oxide dopant. For convenience, a lanthanum oxide ($LaO_x$) dopant, a lanthanide-series metal oxide dopant, and a dopant comprising both lanthanum and a lanthanide-series metal oxide will be referred to herein as an $LnO_x$ dopant, where Ln represents lanthanum and/or a lanthanide-series metal and x is any number greater than zero. In a preferred embodiment of the invention, the dopant used to modify the hafnium oxide layer 14 is lanthanum oxide. As described in more detail below, the dopant may be formed from a source of elemental lanthanum or lanthanide-series metal, from a source of an oxide of lanthanum or an oxide of a lanthanide-series metal, or from a combination of such sources.

Without being bound to any particular theory, it is believed that the $LnO_x$ dopant facilitates enhanced oxidation of the hafnium atoms of the hafnium oxide layer, thus reducing the amount of the oxygen vacancies and the leakage current density of the hafnium oxide layer. Typically, during the hafnium oxide formation, oxygen vacancies may be produced within the hafnium oxide. Lanthanum and lanthanide-series metals have relatively high affinities for oxygen. Accordingly, it is believed that an $LnO_x$ dopant can catalyze the oxidation of hafnium to lower the amount of oxygen vacancies. Moreover, because lanthanum and lanthanide-series metals are metals of Group III of the Periodic Chart and hafnium is a metal of Group IV, doping with an $LnO_x$ dopant may also offer a compensating mechanism analogous to p-type doping. In this regard, a hafnium oxide layer modified with an $LnO_x$ dopant will exhibit less leakage current than an un-modified hafnium oxide layer. In addition, an $LnO_x$ dopant increases the crystallization onset temperature of amorphous hafnium oxide, thus improving the stability of amorphous hafnium oxide during anneal processes. Further, lanthanum and lanthanide-series metals comprise relatively large and heavy atoms and, thus, do not readily diffuse through the surface of the substrate and cause instability at the substrate/hafnium oxide interface.

Referring still to FIG. 1, in an optional embodiment of the present invention, semiconductor structure 10 also may comprise an interface layer 16 overlying substrate 12 and underlying the doped hafnium oxide layer 14. Interface layer 16 may comprise an oxide layer or any other layer designed for optimal device performance. Interface layer 16 is preferably an oxide formed by the oxidation of the surface of substrate 12. In a preferred embodiment of the invention, substrate 12 comprises silicon and interface layer 16 comprises silicon dioxide. Typically, interface layer 16 has a thickness in the range of about 3 to about 10 angstroms.

In another optional embodiment of the invention, semiconductor structure 10 may have a pre-layer 18 comprised of hafnium and/or hafnium oxide. The pre-layer 18 may serve to inhibit or prevent the lanthanum or the lanthanide-series metal from diffusing into and/or interacting with the substrate 12. The pre-layer may have any suitable thickness but preferably has a thickness in the range of 1–5 monolayers.

Figure 2:
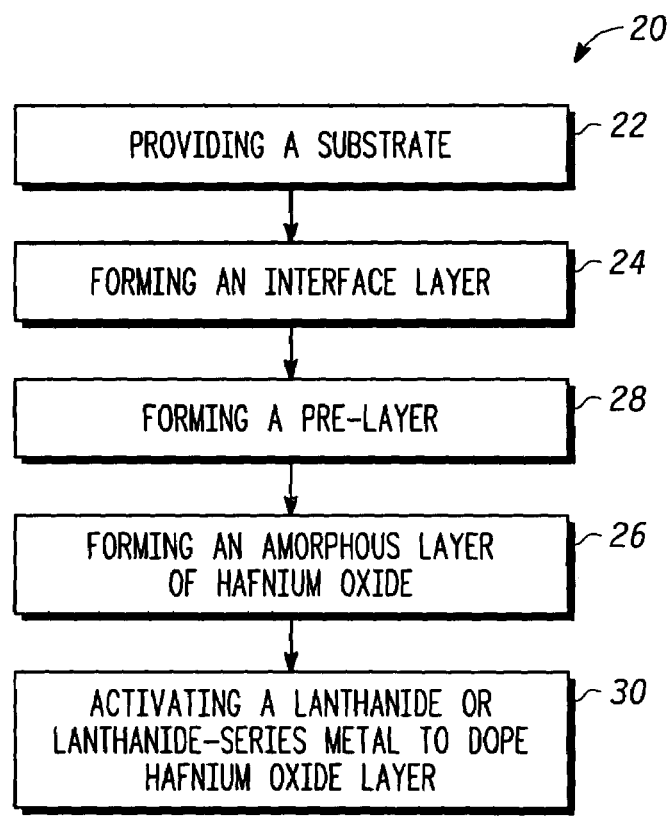
FIG. 2 is a flowchart of a process for forming the semiconductor structure of FIG. 1 in accordance with an embodiment of the present invention.

FIG. 2 is a flowchart of a process 20, in accordance with one embodiment of the present invention, for fabricating a semiconductor structure such as the structure illustrated in FIG. 1. The process 20 begins by providing a substrate (step 22) comprising a suitable semiconductor material, a compound semiconductor material, or a metal, as is well known in the art, that has been cleaned to remove contaminants and oxides from the substrate surface. In accordance with a preferred embodiment of the invention, substrate 12 is a clean silicon substrate.

In an optional embodiment of the invention, an interface layer, such as interface layer 16 of FIG. 1, may be formed overlying substrate 12 (step 24). In one embodiment, the interface layer 16 may be formed by oxidizing the surface of substrate 12. For example, the substrate 12 may be heated, as is well known, at a suitable temperature and oxygen partial pressure to obtain an oxide thickness at the surface of substrate 12 as is desired for a particular device application. It will be appreciated, however, that other methods for forming interface layer 16 may be utilized, such as, for example, using SC-1 and SC-2 cleans and/or using an ultra-violet (UV) ozone cleaning process.

Next, an amorphous layer 14 of hafnium oxide is grown overlying the substrate 12 and the optional interface layer 16 (step 26). Growth of the hafnium oxide layer 14 is preferably carried out by molecular beam epitaxy (MBE). However, the process can also be carried out by chemical vapor deposition (CVD), metal organic chemical vapor deposition (MOCVD), atomic layer deposition (ALD), atomic vapor deposition (AVD), physical vapor deposition (PVD), chemical solution deposition (CSD), pulsed laser deposition (PLD), or the like. It will be understood that optional interface layer 16 may be formed before hafnium oxide layer 14 is formed, as described above, or interface layer 16 may be formed during or after formation of hafnium oxide layer 14 or during doping of hafnium oxide layer 14, as described in more detail below. Alternatively, interface layer 16 may be formed before formation of hafnium oxide layer 14 and may be grown to a greater thickness during formation of hafnium oxide layer 14 and/or during doping of the hafnium oxide layer 14, as described in more detail below. In another embodiment, interface layer 16 may be formed during formation of hafnium oxide layer 14 and may be grown to a greater thickness during doping of hafnium oxide layer 14, as described in more detail below.

The MBE process is initiated by heating the substrate 12 to a temperature in the range of about room temperature (approximately 10° C.) to about 600° C., preferably about 100 to about 400° C., and more preferably about 300° C. A shutter in the MBE apparatus is opened to expose a source of metal hafnium and/or a source of hafnium oxide. Oxygen from a source of molecular oxygen or oxygen plasma may be introduced to the MBE chamber to achieve a partial pressure of oxygen in the range of about $10^{-8}$ to about $10^{-5}$ Torr depending on the hafnium source. For example, if the source is metallic hafnium, a richer oxygen environment may be required to form the amorphous hafnium oxide layer. Alternatively, if the source is hafnium oxide, a less rich oxygen environment may be required. The hafnium oxide layer then may be grown to a predetermined thickness.

In another optional embodiment of the invention, a pre-layer, such as pre-layer 18 of FIG. 1, may be formed overlying substrate 12 and optional interface layer 16 before deposition of the amorphous hafnium oxide layer (step 28). The pre-layer may comprise hafnium deposited in an MBE chamber, or by any other suitable method, in an oxygen-free environment or may comprise hafnium oxide deposited by any of the methods described above for forming the amorphous hafnium oxide layer.

Figure 3:
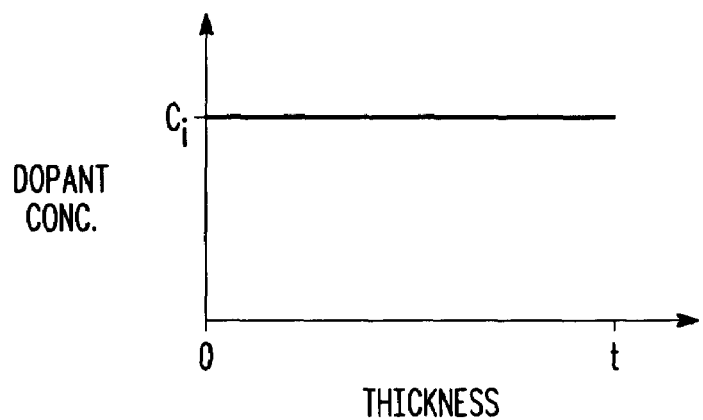
FIG. 3 is a graphical representation of a concentration profile of a lanthanum-containing or a lanthanide-series metal-containing dopant within a hafnium oxide layer of a semiconductor structure fabricated in accordance with an exemplary embodiment of the present invention.

The process 20 of FIG. 2 further comprises the step (step 30) of activating a source of lanthanum and/or a source of a lanthanide-series metal to dope the hafnium oxide layer 14. In one embodiment of the invention, the hafnium oxide layer 14 is doped as the hafnium oxide layer 14 is deposited on substrate 12 so that the concentration of the $LnO_x$ dopant within the hafnium oxide layer 14 is substantially constant. In this regard, as a shutter for the hafnium oxide and/or hafnium metal source is opened, an effusion cell comprising lanthanum or an effusion cell comprising a lanthanide-series metal is activated, such as by heating, to form a lanthanum and/or lanthanide-series metal flux. Alternatively, an e-beam source comprising lanthanum oxide and/or an e-beam source comprising a lanthanide-series metal oxide may be utilized to form a lanthanum oxide flux and/or a lanthanide-series metal oxide flux. The flux may be such that the resulting concentration of the $LnO_x$ dopant within the hafnium oxide layer is sufficiently high to stabilize the amorphous state of the hafnium oxide but is not so large that the dopant causes phase separation and/or has a negative impact on the substrate/hafnium oxide interface. The flux may also be set so that the resulting $LnO_x$-modified hafnium oxide layer will exhibit a leakage current suitable for a desired device application. In one embodiment of the invention, the concentration of the $LnO_x$ dopant within the hafnium oxide layer 14 may be substantially constant in the range of about 5 atomic percent (at. %) to about 50 at. % relative to the hafnium in the hafnium oxide layer. Preferably, the concentration of the $LnO_x$ dopant is in the range of about 5 to about 20 at. %. In a more preferred embodiment of the invention, the concentration of the $LnO_x$ dopant is about 10 at. %. FIG. 3 is a graphic representation of a concentration profile of the $LnO_x$ dopant relative to the thickness of the hafnium oxide layer 14 for the above-described process. As illustrated, using the above-described process, the dopant concentration remains relatively constant at a concentration $C_1$ throughout the thickness "t" of hafnium oxide layer 14.

While the above process describes the formation of an $LnO_x$-modified hafnium oxide layer 14 in an oxygen environment, it will be appreciated that the hafnium oxide layer can be co-doped with a second material. For example, in one embodiment of the invention, the hafnium oxide layer can be grown utilizing a hafnium oxide and/or metal hafnium source in an environment containing oxygen and nitrogen so that the hafnium oxide layer is doped with both $LnO_x$ and nitrogen. Similarly, in another embodiment of the invention, the hafnium oxide layer may be grown utilizing a hafnium oxide source in an environment comprising only nitrogen. Further, it will be appreciated that the hafnium oxide layer may be doped with any other second, third or more materials to form a hafnium oxide layer having physical, chemical, or electrical properties suitable for a desired device application.

Figure 4:
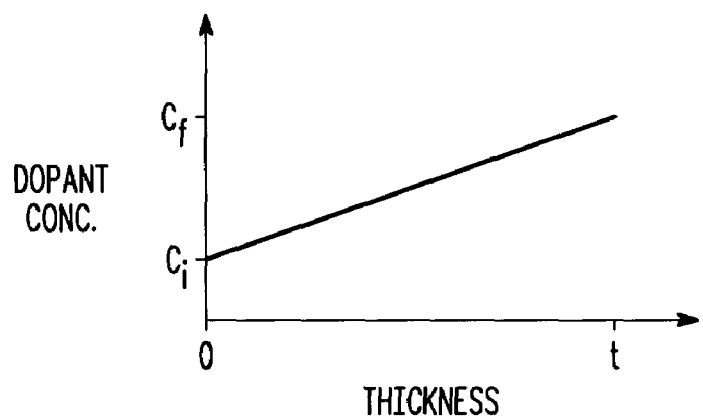
FIG. 4 is a graphical representation of a concentration profile of a lanthanum-containing or a lanthanide-series metal-containing dopant within a hafnium oxide layer of a semiconductor structure fabricated in accordance with another exemplary embodiment of the present invention.

In another embodiment of the invention, the flux of the $LnO_x$ dopant may be increased as the hafnium oxide layer 14 is deposited on substrate 12 so that the concentration of the dopant within the hafnium oxide layer 14 has the concentration profile illustrated in FIG. 4. In this regard, the concentration of the $LnO_x$ dopant at the substrate/hafnium oxide interface may be controlled to further reduce or minimize the diffusion of the lanthanum and/or lanthanide-series metal at the interface and, hence, reduce or minimize instability at the interface. In one embodiment of the invention, the dopant concentration may be increased from an initial concentration $C_i$ in the range of about 0% at. wt. to about 50% at. wt. to any suitable final concentration $C_f$. Preferably, the initial concentration $C_i$ of the $LnO_x$ dopant may be in the range of about 0 to about 20% at. wt. In a more preferred embodiment of the invention, the initial concentration $C_i$ of the $LnO_x$ dopant may be in the range of about 0 to about 10% at. wt.

Figure 5:
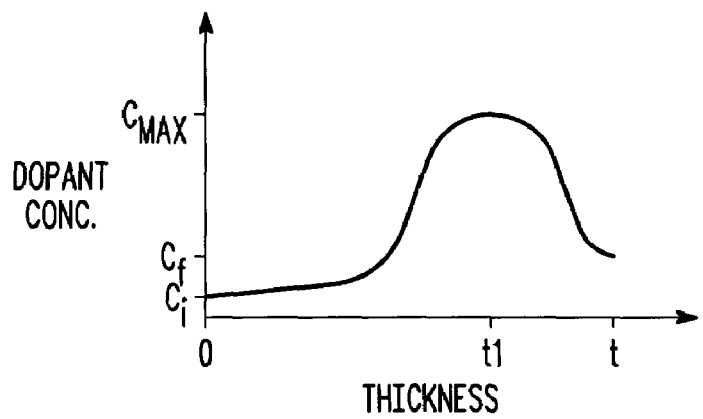
FIG. 5 is a graphical representation of a concentration profile of a lanthanum-containing or a lanthanide-series metal-containing dopant within a hafnium oxide layer of a semiconductor structure fabricated in accordance with a further exemplary embodiment of the present invention.

In yet another embodiment of the invention, the flux may be controlled during formation of the hafnium oxide layer to effect an $LnO_x$ concentration within the hafnium oxide layer 14 that causes the layer 14 to exhibit desired electrical or physical characteristics suitable for a particular device application. For example, referring to FIG. 5, as the hafnium oxide layer 14 is deposited on substrate 12 to a thickness $t_1$, the flux of the $LnO_x$ dopant may be increased such that the $LnO_x$ dopant concentration within layer 14 increases from an initial concentration $C_i$ to a maximum concentration $C_{max}$. In this regard, the dopant concentration may be increased from an initial concentration $C_i$ in the range of about 0 at. % to about 50 at. % relative to the hafnium to any suitable maximum concentration $C_{max}$. Preferably, the initial concentration $C_i$ of the $LnO_x$ dopant may be in the range of about 0 to about 20 at. %. In a more preferred embodiment of the invention, the initial concentration $C_i$ of the $LnO_x$ dopant may be in the range of about 0 to about 10 at. %. After the hafnium oxide layer 14 has reached thickness $t_1$, the flux of the $LnO_x$ dopant may be decreased such that the $LnO_x$ dopant concentration decreases to a final concentration $C_f$, which may be equal to the initial concentration $C_i$ or may be another suitable concentration.

In a further embodiment of the present invention, the hafnium oxide layer 14 may be doped with the $LnO_x$ dopant after the hafnium oxide layer 14 is deposited on substrate 12. If the $LnO_x$ dopant flux is maintained constant, the dopant concentration within layer 14 may have a profile similar to that illustrated in FIG. 4. In this regard, the dopant concentration within the hafnium oxide layer may increase from an initial concentration $C_i$ in the range of about 0 at. % to about 50 at. % relative to the hafnium to any suitable final concentration $C_f$. Preferably, the initial concentration $C_i$ of the $LnO_x$ dopant may be in the range of about 0 to about 20 at. %. In a more preferred embodiment of the invention, the initial concentration $C_i$ of the $LnO_x$ dopant may be in the range of about 0 to about 10 at. %. It will be appreciated, however, that the dopant flux may be controlled to create a hafnium oxide layer exhibiting any suitable dopant concentration profile, such as any of the profiles described above with reference to FIGS. 3–5. Further, it will be understood that the hafnium oxide layer may also be doped with a second material, a third material, and the like, before or after doping with the $LnO_x$ dopant to fabricate a hafnium oxide layer exhibiting physical, chemical, or electrical properties suitable for a particular device application.

Following fabrication of the $LnO_x$-modified hafnium oxide layer 14, the semiconductor structure 10 may be subjected to further processing. For example, semiconductor substrate 10 may be subjected to an anneal process, as is typical in complementary metal oxide semiconductor (CMOS) processing. Alternatively, or in addition, the semiconductor structure 10 may be subjected to other subsequent processing techniques, such as metal deposition, to form a semiconductor device.

EXAMPLE

To determine the affect of an $LnO_x$ dopant on the electrical and physical characteristics of semiconductor structures of the present invention, semiconductor structures comprising $LaO_x$-modified hafnium oxide layers were compared to semiconductor structures comprising undoped hafnium oxide layers. Three three-inch n-Si substrates were subjected to an SC-1 and an SC-2 clean to clean the surface of the substrates and to grow silicon dioxide interface layers having a thickness of from about 8 to about 10 angstroms. After cleaning, each of the silicon substrates was introduced to an MBE chamber. In the MBE chamber, the substrates were heated to a temperature of approximately 300–400° C. and a partial pressure of molecular oxygen of approximately $10^{-7}$ Torr was established and maintained within the MBE chamber. A hafnium oxide source was then evaporated using an electron beam to create a hafnium oxide flux and an effusion cell of lanthanum was heated to create a lanthanum flux. The silicon substrates were simultaneously exposed to the hafnium oxide flux and the lanthanum flux. Lanthanum flux was varied for each run so that hafnium oxide layers were created on each substrate comprising approximately 10 at. % lanthanum (relative to hafnium), 20 at. % lanthanum, and 33 at. % lanthanum, respectively. The $LaO_x$-modified hafnium oxide layers were deposited overlying the silicon dioxide interface layers to thicknesses of approximately 35 angstroms and the deposition processes were monitored using RHEED monitoring techniques.

The physical characteristics of the $LaO_x$-modified hafnium oxide layers then were compared to undoped hafnium oxide layers that were grown to comparable thicknesses in an MBE chamber. RHEED results indicated that the $LaO_x$-modified hafnium oxide layers remained amorphous.

The semiconductor structures were also tested to determine the leakage current through the hafnium oxide layers of the structures and to determine the hysteresis and flatband voltage of the structures. Three samples were taken of each substrate. The results of the tests are set forth in Tables 1 and 2:

TABLE 1

| Sample No. | La (at. %) | Leakage Current (A/cm$^{-2}$) |
| --- | --- | --- |
| 1 | 0 | 5.00E–03 |
| 2 | 0 | 6.00E–03 |
| 3 | 0 | 5.00E–03 |
| 4 | 10 | 1.00E–03 |
| 5 | 10 | 1.00E–03 |
| 6 | 10 | 6.00E–04 |
| 7 | 20 | 8.00E–05 |
| 8 | 20 | 2.00E–04 |
| 9 | 20 | 8.00E–05 |
| 10 | 33 | 4.00E–06 |
| 11 | 33 | 9.00E–06 |
| 12 | 33 | 8.00E–06 |

TABLE 2

| Sample No. | La (at. %) | Hysteresis (mV) | CET (A) | Vfb (V) |
| --- | --- | --- | --- | --- |
| 1 | 0 | 29 | 15.3 | 0.59 |
| 2 | 0 | 31 | 15.3 | 0.569 |
| 3 | 0 | 27 | 16 | 0.587 |
| 4 | 10 | 14 | 15.5 | 0.523 |
| 5 | 10 | 19 | 15.6 | 0.478 |
| 6 | 10 | 15 | 15.4 | 0.485 |
| 7 | 20 | 7 | 15.9 | 0.467 |
| 8 | 20 | 7 | 15.3 | 0.462 |
| 9 | 20 | 3 | 16.4 | 0.442 |
| 10 | 33 | 0 | 16.3 | 0.427 |
| 11 | 33 | 4 | 15.4 | 0.421 |
| 12 | 33 | 5 | 15.7 | 0.389 |

The above results illustrate that, as the concentration of the $LaO_x$ dopant increased within the hafnium oxide layers, the leakage current through the hafnium oxide layers decreased. Further, as the concentration of the $LaO_x$ dopant increased within the hafnium oxide layers, hysteresis decreased, indicating fewer charge traps, with the capacitance equivalent thickness (CET) remaining substantially the same. The flatband voltage (Vfb) also decreased, indicating less negative fixed charge. Accordingly, presence of the $LaO_x$ dopant improved the electrical characteristics of the semiconductor structures.

Accordingly, semiconductor structures and methods for fabricating semiconductor structures utilizing $LnO_x$-modified hafnium oxide layers in accordance with the present invention has been described. The inventions provide for semiconductor structures comprising a high k dielectric material, hafnium oxide, that exhibits increased crystallization onset temperatures and a stable amorphous phase. The semiconductor structures also may demonstrate lower leakage current and other improved electrical properties. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A semiconductor structure, comprising:
   a substrate;
   an amorphous layer of hafnium oxide overlying the substrate; and
   a dopant comprising at least one of lanthanum oxide, a lanthanide-series metal oxide, and a combination of lanthanum oxide and a lanthanide-series metal oxide, wherein the dopant is comprised within the amorphous layer of hafnium oxide.

2. The semiconductor structure of claim 1, wherein the substrate comprises silicon.

3. The semiconductor structure of claim 1, wherein the amorphous layer of hafnium oxide has a thickness in the range of from about 25 angstroms to about 50 angstroms.

4. The semiconductor structure of claim 1, further comprising an interface layer overlying the substrate and underlying the amorphous layer of hafnium oxide.

5. The semiconductor structure of claim 4, wherein the interface layer has a thickness in the range of about 3 to about 10 angstroms.

6. The semiconductor structure of claim 4, wherein the substrate comprises silicon and the interface layer comprises silicon dioxide.

7. The semiconductor structure of claim 1, wherein a concentration of the dopant within the amorphous layer of hafnium oxide is greater than about zero and no greater than about 50 atomic percent relative to hafnium within the amorphous layer of hafnium oxide.

8. The semiconductor structure of claim 1, wherein a concentration of the dopant is substantially constant within the amorphous layer of hafnium oxide.

9. The semiconductor structure of claim 1, a concentration of the dopant within the amorphous layer of hafnium oxide increasing from an initial concentration to a maximum concentration, wherein the maximum concentration is greater than the initial concentration.

10. The semiconductor structure of claim 9, wherein the initial concentration is zero.

11. The semiconductor structure of claim 1, further comprising a pre-layer underlying the amorphous layer of hafnium oxide, the pre-layer comprising hafnium, hafnium oxide, or hafnium and hafnium oxide.

* * * * *